(12) United States Patent
Roy Paladhi et al.

(10) Patent No.: US 11,399,428 B2
(45) Date of Patent: Jul. 26, 2022

(54) PCB WITH SUBSTRATE INTEGRATED WAVEGUIDES USING MULTI-BAND MONOPOLE ANTENNA FEEDS FOR HIGH SPEED COMMUNICATION

(71) Applicant: International Business Machines Corporation, Armonk, NY (US)

(72) Inventors: Pavel Roy Paladhi, Austin, TX (US); Jose A. Hejase, Austin, TX (US); Junyan Tang, Austin, TX (US); Joshua C. Myers, Austin, TX (US); Sungjun Chun, Austin, TX (US); Wiren D. Becker, Hyde Park, NY (US); Daniel M. Dreps, Georgetown, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 92 days.

(21) Appl. No.: 16/600,795

(22) Filed: Oct. 14, 2019

(65) Prior Publication Data

US 2021/0112655 A1     Apr. 15, 2021

(51) Int. Cl.
*H01P 3/12*     (2006.01)
*H05K 1/02*     (2006.01)
(Continued)

(52) U.S. Cl.
CPC ........... *H05K 1/0243* (2013.01); *H01P 3/121* (2013.01); *H01Q 1/2283* (2013.01); *H01Q 5/10* (2015.01);
(Continued)

(58) Field of Classification Search
CPC ................... H05K 1/0243; H01Q 1/22; H01Q 5/10–5/35; H01P 1/207; H01P 3/121
See application file for complete search history.

(56) References Cited

U.S. PATENT DOCUMENTS 4,716,386 A    12/1987   Lait
5,539,361 A    7/1996   Davidovitz
(Continued)

FOREIGN PATENT DOCUMENTS

CN     107968261 A    4/2018
CN     108832245 A    11/2018
(Continued)

OTHER PUBLICATIONS

Paladhi et al., *Dual-band Monopole Antenna Feeds for Substrate Integrated Waveguides*, 2018 IEEE 27th Conference on Electrical Performance of Electronic Packaging and Systems (EPEPS), IEEE, DOI: 10.1109/EPEPS.2018.8534265, Date of Conference: Oct. 14-17, 2018, Date Added to IEEEXplore: Nov. 15, 2018.
(Continued)

*Primary Examiner* — Hasan Islam
(74) *Attorney, Agent, or Firm* — Nathan M. Rau

(57) ABSTRACT

A printed circuit board ('PCB') including a substrate integrated waveguide ('SIW') formed using two ground planes representing the top and bottom walls of the waveguide, tightly pitched ground vias to act as two side walls and two back walls, and a pair of monopole antennas placed at each end of the SIW acting as signal feeding/receiving structures is disclosed. The waveguide dominant mode cut off frequency is determined by the spacing between the two side walls. Within each monopole antenna pair, the first monopole antenna operates at a first frequency while the second monopole antenna operates at another frequency. For each monopole antenna pair, the first monopole antenna and the second monopole antenna are located in the SIW at a distance from the back wall optimal for each operating frequency.

17 Claims, 6 Drawing Sheets

(51) Int. Cl.
*H05K 1/11* (2006.01)
*H01Q 9/40* (2006.01)
*H01Q 5/10* (2015.01)
*H01Q 1/22* (2006.01)

(52) U.S. Cl.
CPC .............. *H01Q 9/40* (2013.01); *H05K 1/116* (2013.01); *H05K 2201/037* (2013.01); *H05K 2201/093* (2013.01)

(56) References Cited

U.S. PATENT DOCUMENTS

| | | | |
|---|---|---|---|
| 6,359,590 B2 | 3/2002 | Takenoshita | |
| 6,515,562 B1 | 2/2003 | Takenoshita et al. | |
| 7,079,079 B2* | 7/2006 | Jo | H01Q 1/243 343/700 MS |
| 7,205,862 B2 | 4/2007 | Tahara et al. | |
| 8,576,023 B1 | 11/2013 | Buckley et al. | |
| 8,598,961 B2 | 12/2013 | Hasselblad et al. | |
| 9,531,052 B2 | 12/2016 | Dang et al. | |
| 10,141,623 B2 | 11/2018 | Connor et al. | |
| 10,665,917 B2* | 5/2020 | Frank | H01P 1/207 |
| 2012/0293279 A1* | 11/2012 | Gong | H01P 3/121 333/202 |
| 2015/0318618 A1* | 11/2015 | Chen | H01Q 9/0442 343/750 |
| 2017/0346169 A1* | 11/2017 | Wang | G01S 13/4463 |
| 2018/0248241 A1 | 8/2018 | Frank et al. | |
| 2019/0057945 A1 | 2/2019 | Maaskant et al. | |
| 2020/0059010 A1* | 2/2020 | Yang | H01Q 21/065 |
| 2020/0067178 A1* | 2/2020 | Hu | H01Q 1/48 |
| 2021/0210857 A1* | 7/2021 | Sayama | H01Q 13/10 |

FOREIGN PATENT DOCUMENTS

| | | |
|---|---|---|
| CN | 109273832 A | 1/2019 |
| GB | 2497982 B | 4/2014 |
| IN | 201631001532 A | 12/2017 |

OTHER PUBLICATIONS

Meyers et al., *Vertical and Horizontal Transitions of Substrate Integrated Waveguides Within a Multi-Layered PCB for High Speed Signaling Applications*, IEEE 27th Conference on Electrical Performance of Electronic Packaging and Systems (EPEPS), Nov. 2018, 3 pages, IEEE Xplore digital Library online (IEEE.org), DOI: 10.1109/EPEPS.2018.8534285.

U.S. Appl. No. 16/600,760, to Joshua C. Meyers et al., entitled, *Vertically Transitioning Signals Between Substrate Integrated Waveguides (SIWs) Within a Multilayered Printed Circuit Board (PCB)*, assigned to International Business Machines Corporation, 37 pages, filed Oct. 14, 2019.

Appendix P; List of IBM Patent or Applications Treated as Related, Oct. 14, 2019, 2 pages.

* cited by examiner

PCB WITH SUBSTRATE INTEGRATED WAVEGUIDES USING MULTI-BAND MONOPOLE ANTENNA FEEDS FOR HIGH SPEED COMMUNICATION

BACKGROUND

Field of the Invention

The field of the present disclosure is high speed signaling, or, more specifically, methods, apparatus, and products for providing a printed circuit board ('PCB') with substrate integrated waveguides ('SIW') that uses multi-band monopole antenna feeds for high speed communications.

Description of Related Art

In current computing environments including servers, high speed communication buses have increasing data transfer rates and bandwidth. As data rates increase, signal frequency bandwidths are increasing in size, going from microwave to millimeter wave frequencies. Communications waveguides or transmission lines characterized with low attenuations at higher frequencies are desired.

SUMMARY

Methods, systems, and apparatus for providing a PCB with SIW that uses multi-band monopole antenna feeds for high speed communications are disclosed in this specification. A PCB with SIW using multi-band monopole antenna feeds for high speed communications is provided by a printed circuit board including a substrate integrated waveguide formed by two ground planes and ground vias spaced so as to act as two side walls and a back wall with the spacing between the two side walls determining a waveguide dominant mode cutoff frequency; a first monopole antenna; and a second monopole antenna, wherein the first monopole antenna and the second monopole antenna are located in the SIW at a distance from the back wall optimal for each operating frequency.

Creating a SIW within a PCB includes determining desired physical configuration attributes for an SIW formed by two ground planes and ground vias, the ground vias spaced so as to act as two side walls and a back wall with the spacing between the two side walls determining a waveguide dominant mode cutoff frequency; determining the location of a first monopole antenna, wherein the first monopole antenna is located in the SIW at a distance from the back wall optimal for its operating frequency; and determining the location of a second monopole antenna, wherein the second monopole antenna is located in the SIW at a distance from the back wall optimal for its operating frequency.

The foregoing and other objects, features and advantages of the disclosure will be apparent from the following more particular descriptions of exemplary embodiments of the present disclosure as illustrated in the accompanying drawings wherein like reference numbers generally represent like parts of exemplary embodiments of the present disclosure.

DETAILED DESCRIPTION

Figure 1:
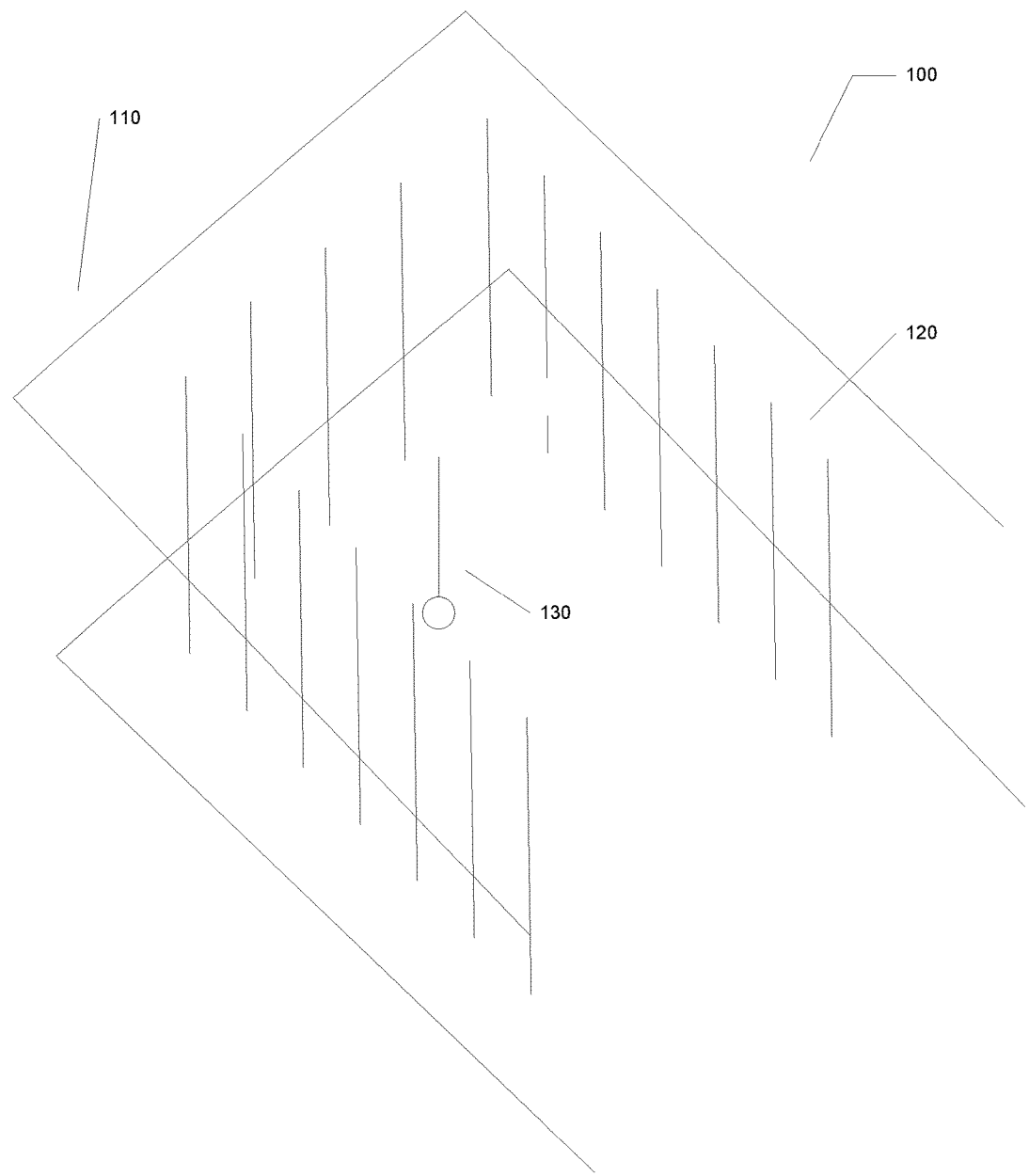
FIG. 1 sets forth a 3D diagram for providing a PCB with SIW that uses a single-band monopole antenna feed for high speed communications according to embodiments of the present disclosure.

Example multi-layer printed circuit boards ('PCBs') as well as methods of making and using such PCBs with SIW using multi-band monopole antenna feeds for high speed communications in accordance with the present disclosure are described with reference to the accompanying drawings, beginning with FIG. 1. FIG. 1 sets forth a 3D diagram of an exemplary PCB (100) configured for providing a PCB with SIW that uses multi-band monopole antenna feeds for high speed communications according to embodiments of the present disclosure.

A PCB includes multiple layers of conductive layers including power planes and ground planes and substrate layers with etched conductive pathways. In a PCB with a microstrip or stripline, a signal is propagated down the microstrip or stripline. Microstrips and striplines are small, as small as less than 1 mm width including spacing, and are easy to fabricate. However, microstrips and striplines are lossy. In a rectangular waveguide, a signal is propagated down the waveguide. The rectangular waveguide is filled with a dielectric and the side walls are metal. A substrate integrated waveguide is formed by a top and bottom ground plane of a PCB with side walls formed by closely spaced ground vias. A SIW includes an antenna at one end that transmits or feeds the signal and an antenna at the other end that receives the signal. A SIW is more difficult to fabricate and has a large footprint in the PCB compared to a stripline or microstrip but has low loss.

In the example of FIG. 1, the PCB (100) includes at least two ground planes (110) as well as ground vias (120) which are spaced so as to act as two side walls and a back wall and a monopole antenna (130) that sends a high frequency signal down the SIW. Additionally, FIG. 1 shows only one half of the SIW and shows the transmitting monopole antenna (130). Not shown is the other half of the SIW and the receiving monopole antenna that is the same as the transmitting monopole antenna (130). Readers will appreciate that additional layers of the PCB (100) may be included above and below the layer illustrated in FIG. 1.

In the PCB (100) of FIG. 1, the monopole antenna (130) is a quarter wave monopole antenna and is placed at a determined distance, e.g., a quarter of the guided wavelength ($\lambda_g$), from the back wall. Not shown is the receiving monopole antenna that is similarly placed at the determined distance from the other back wall. In an exemplary embodiment, the width of the SIW is chosen to determine the waveguide dominant mode frequency range, formed by the two side walls of closely spaced ground vias. The dominant mode is a high frequency range, e.g. in a range of 70-128 GHz, or another selected dominant mode. The monopole antenna (130) operating frequency is selected to be centered at a particular frequency within the waveguide dominant mode frequency range. Within the dominant mode, the high frequency signal has high power/low insertion loss. Compared to a microstrip or stripline, the signal has low loss. However, the single high frequency signal in the SIW has a larger footprint in the PCB than a traditional stripline.

Figure 2A:
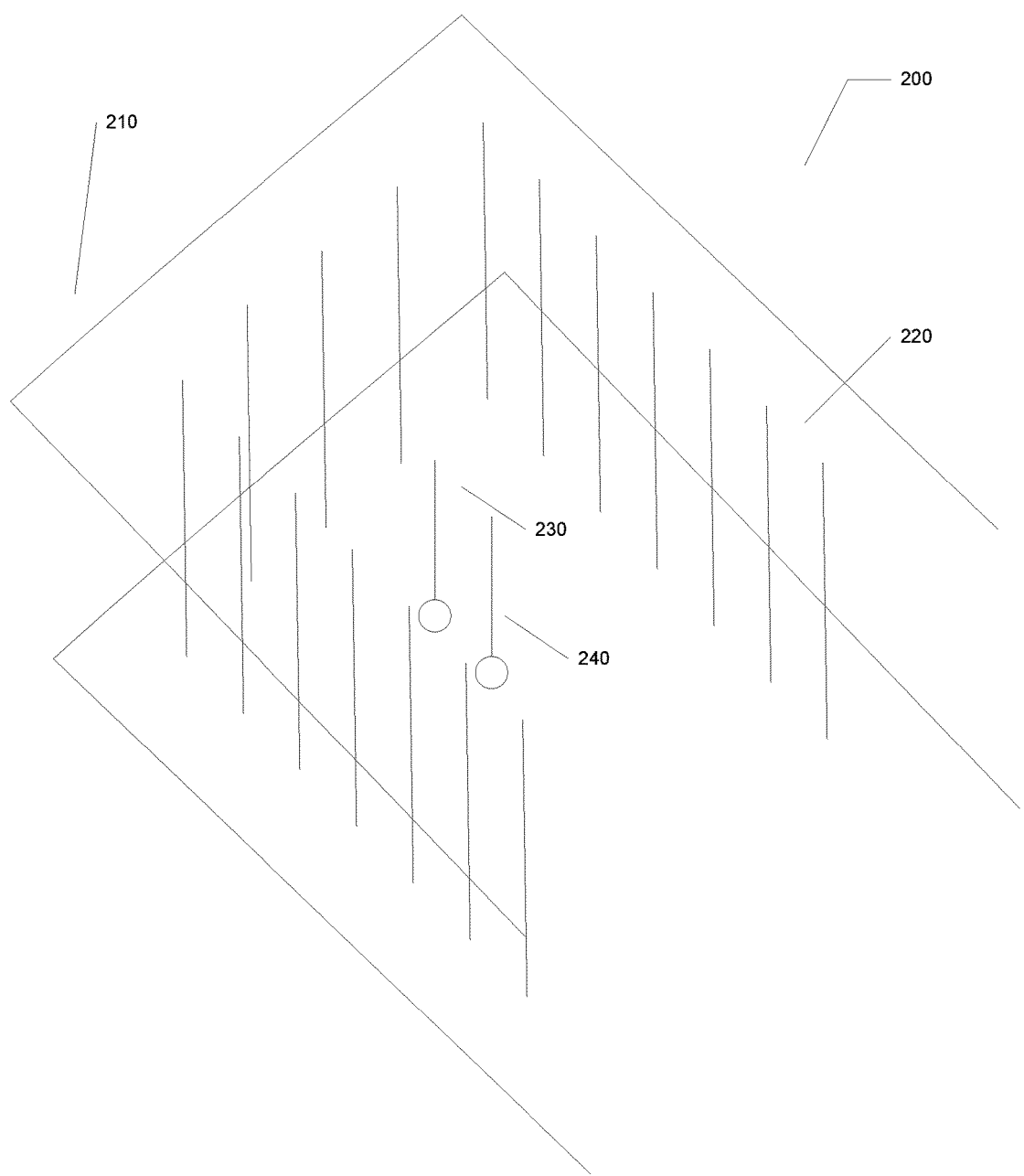
FIG. 2A sets forth a 3D diagram for providing a PCB with SIW that uses multi-band monopole antenna feeds for high speed communications according to embodiments of the present disclosure.

For further explanation, FIG. 2A sets forth a 3D diagram of a PCB (200) configured for providing a PCB with SIW that uses multi-band monopole antenna feeds for high speed communications according to embodiments of the present disclosure. In the example of FIG. 2A, the PCB (200) includes at least two ground planes (210) as well as ground vias (220) which are spaced so as to act as two side walls and a back wall and a monopole antenna (230) that sends a high frequency signal down the SIW. The PCB (200) differs from the PCB (100) of FIG. 1, however, in that the PCB (200) also includes a monopole antenna (240) that sends a different high frequency signal down the SIW. Additionally, FIG. 2A shows only one half of the SIW and shows the transmitting monopole antenna (230) and transmitting monopole antenna (240). Not shown is the other half of the SIW and the receiving monopole antennas that are the same as the transmitting monopole antenna (230) and transmitting monopole antenna (240). Readers will appreciate that additional layers of the PCB (200) may be included above and below the layer illustrated in FIG. 2A.

In the PCB (200) of FIG. 2A, the monopole antenna (230) is a quarter wave monopole antenna and is placed at a determined distance, e.g., a quarter of the guided wavelength ($\lambda_g$), from the back wall. Similarly, the monopole antenna (240) is a quarter wave monopole antenna and is placed at a determined distance, e.g., a quarter of the guided wavelength ($\lambda_g$), from the back wall. Not shown are the receiving monopole antennas that are similarly placed at the determined distances from the other back wall. In an exemplary embodiment, the width of the SIW is chosen to determine the dominant mode, formed by the two side walls of closely spaced ground vias. The dominant mode is a high frequency range, e.g. in a range of 70-128 GHz, or another selected dominant mode. The monopole antenna (230) operating frequency is selected to be centered at a particular frequency within one half of the waveguide dominant mode frequency range, and the monopole antenna (240) operating frequency is selected to be centered at a particular frequency within the other half of the waveguide dominant mode frequency range. In an exemplary embodiment, the monopole antenna (230) operating frequency is centered at 112 GHz and monopole antenna (240) operating frequency is centered at 84 GHz. Within the dominant mode, the high frequency signals have low insertion loss and, because they are in two separate frequency ranges, very little or no crosstalk. Also, because two signals are being sent in the SIW, the footprint of the SIW compares favorably to that of the traditional stripline.

Figure 2B:
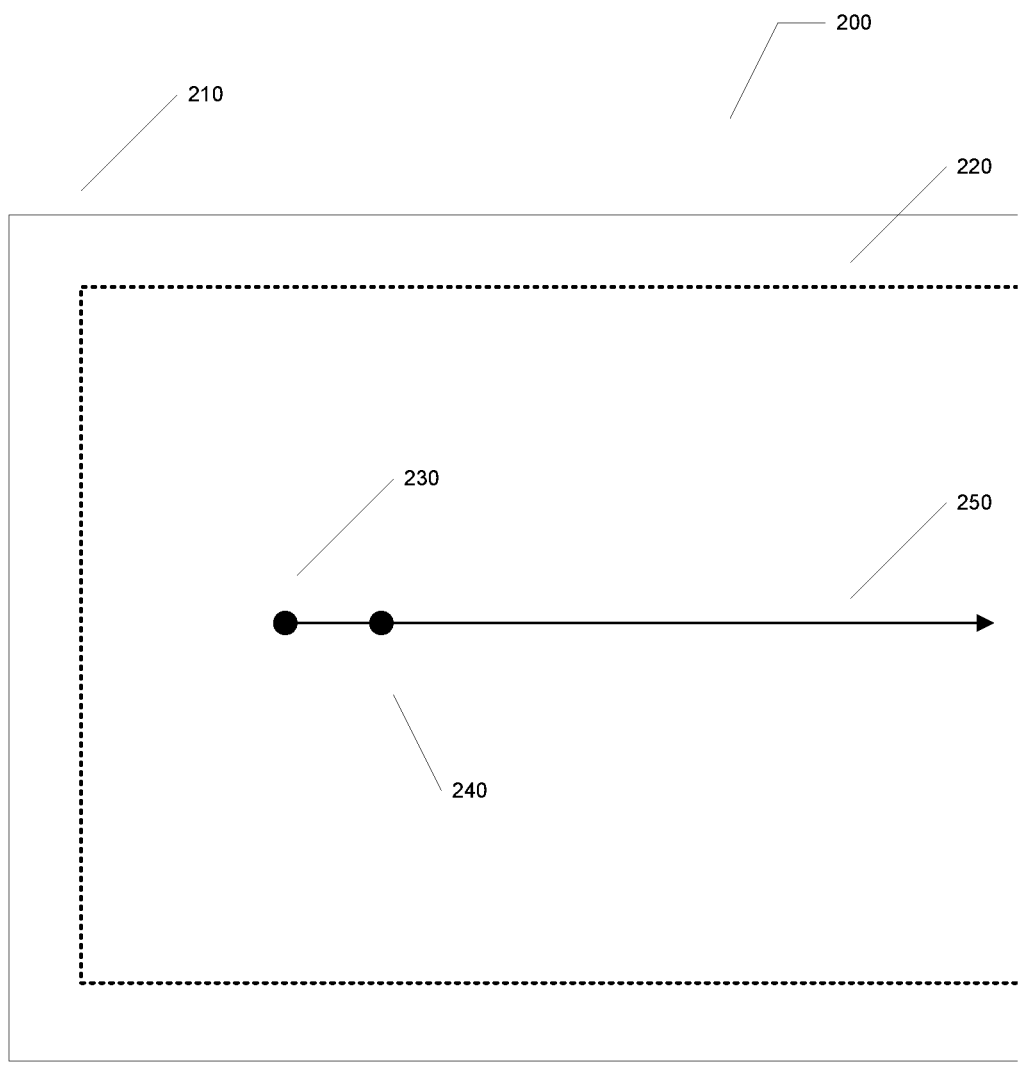
FIG. 2B sets forth a top down 2D diagram for providing a PCB with SIW that uses multi-band monopole antenna feeds for high speed communications according to embodiments of the present disclosure.

For further explanation, FIG. 2B sets forth a top down diagram of a PCB (200) configured for providing a PCB with SIW that uses multi-band monopole antenna feeds for high speed communications according to embodiments of the present disclosure. As in the example of FIG. 2A, the PCB (200) of FIG. 2B includes at least two ground planes (210) as well as ground vias (220) which are spaced so as to act as two side walls and a back wall and monopole antenna (230) that sends a high frequency signal down the SIW as well as monopole antenna (240) that sends a different high frequency signal down the SIW. The axis (250) is also shown in FIG. 2B. As in the example of FIG. 2A, FIG. 2B shows only one half of the SIW and shows the transmitting monopole antenna (230) and transmitting monopole antenna (240). Not shown is the other half of the SIW and the receiving monopole antennas that are the same as the transmitting monopole antenna (230) and transmitting monopole antenna (240). Readers will appreciate that additional layers of the PCB (200) may be included above and below the layer illustrated in FIG. 2B.

As shown in FIG. 2B, monopole antenna (230) is located on axis (250) and monopole antenna (240) is located on axis (250). Each monopole antenna (230) and monopole antenna (240) is located at a determined distance e.g., a quarter of the guided wavelength ($\lambda_g$), from the back wall. Because the monopole antenna (230) and monopole antenna (240) have different signal frequencies, they are located a distance apart from each other on axis (250). However, when the monopole antenna (230) and monopole antenna (240) are placed together in the same SIW, the insertion loss for each monopole antenna (230) and monopole antenna (240) together is greater than for each monopole antenna (230) and monopole antenna (240) singly. The monopole antenna (230) performs worse, because the monopole antenna (240) is situated in front of it, reflecting a major part of the outgoing radiation. For the monopole antenna (240), the monopole antenna (230) is between it and the back wall, interfering in the formation of its propagation modes. It is desirable to change the position of the monopole antennas to minimize the insertion loss.

Figure 3:
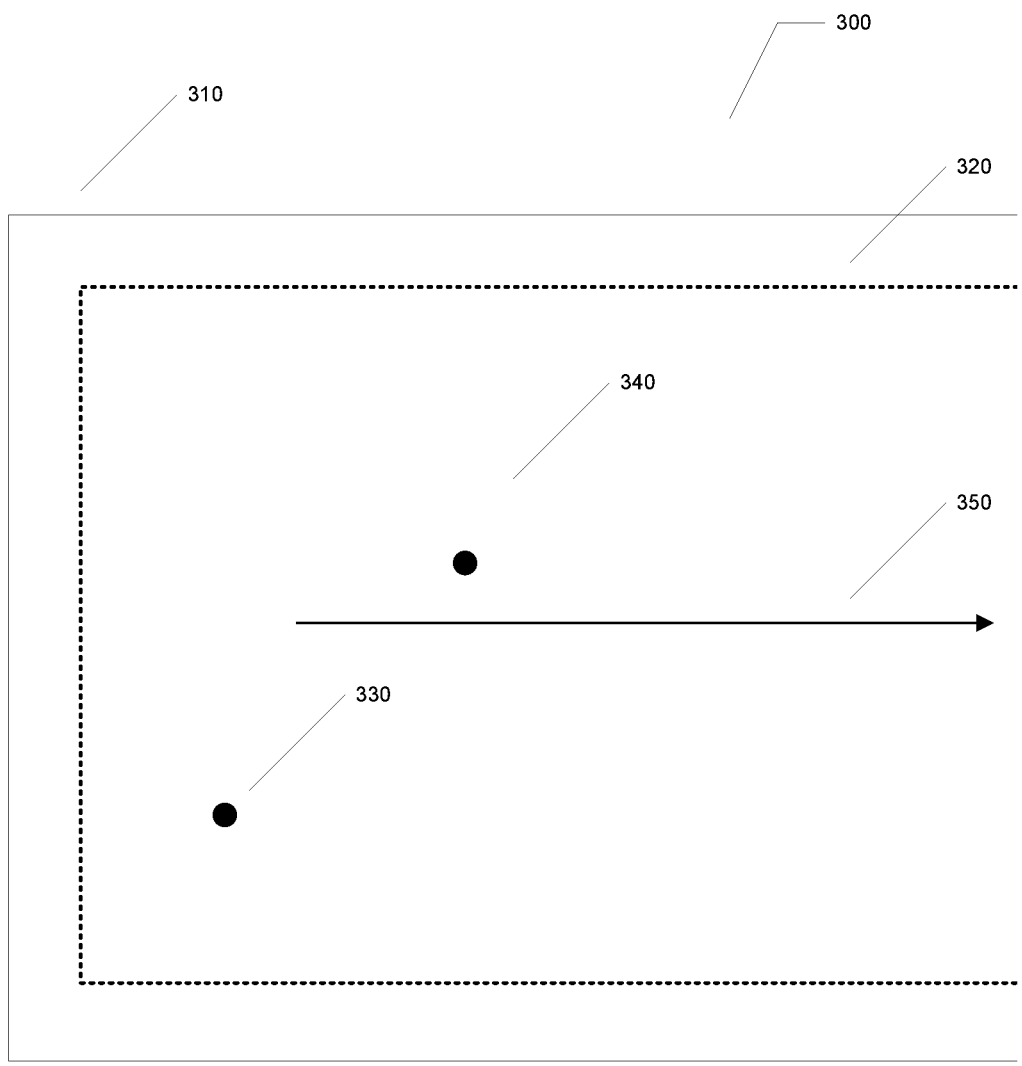
FIG. 3 sets forth a top down 2D diagram for providing a PCB with SIW that uses multi-band monopole antenna feeds for high speed communications according to embodiments of the present disclosure.

For further explanation, FIG. 3 sets forth a top down diagram of a PCB (300) configured for providing a PCB with SIW that uses multi-band monopole antenna feeds for high speed communications according to embodiments of the present disclosure. In the example of FIG. 3, the PCB (300) includes at least two ground planes (310) as well as ground vias (320) which are spaced so as to act as two side walls and a back wall and a monopole antenna (330) that sends a high frequency signal down the SIW as well as monopole antenna (340) that sends a different high frequency signal down the SIW. The axis (350) is also shown in FIG. 3. Additionally, FIG. 3 shows only one half of the SIW and shows the transmitting monopole antenna (330) and transmitting monopole antenna (340). Not shown is the other half of the SIW and the receiving monopole antennas that are the same as the transmitting monopole antenna (330) and transmitting monopole antenna (340). The PCB (300) differs from the PCB (200) of FIG. 2, however, in that monopole antenna (330) and monopole antenna (340) of the PCB (300) are offset. Readers will appreciate that additional layers of the PCB (300) may be included above and below the layer illustrated in FIG. 3.

In the PCB (300) of FIG. 3, the monopole antenna (330) is a quarter wave monopole antenna and is placed at a determined distance, e.g., a quarter of the guided wavelength ($\lambda_g$), from the back wall. Similarly, the monopole antenna (340) is a quarter wave monopole antenna and is placed at a determined distance, e.g., a quarter of the guided wavelength ($\lambda_g$), from the back wall. Not shown are the receiving monopole antennas that are similarly placed at the determined distances from the other back wall. In an exemplary embodiment, the width of the SIW is chosen to determine the waveguide dominant mode frequency range, formed by the two side walls of closely spaced ground vias. The dominant mode is a high frequency range, e.g. in a range of 70-128 GHz, or another selected dominant mode. The monopole antenna (330) operating frequency is selected to be centered at a particular frequency within one half of the waveguide dominant mode frequency range, and the monopole antenna (340) operating frequency is selected to be centered at a particular frequency within the other half of the waveguide dominant mode frequency range. Within the dominant mode, the high frequency signals have low insertion loss and, because they are in two separate frequency ranges, no crosstalk occurs. Also, because two signals are being sent simultaneously through a single SIW, the footprint of the SIW compares favorably to that of the traditional stripline.

As described above in FIG. 2B, when the monopole antenna (230) and monopole antenna (240) are placed together in the same SIW along axis (250), the insertion loss for each monopole antenna (230) and monopole antenna (240) together is greater than for each monopole antenna (230) and monopole antenna (240) singly. The monopole antenna (230) performs worse, because the monopole antenna (240) is situated in front of it, reflecting a major part of the outgoing radiation. For the monopole antenna (240), the monopole antenna (230) is between it and the back wall, interfering in the formation of its propagation modes. Therefore, in FIG. 3, monopole antenna (330) and monopole antenna (340) are offset laterally, i.e., perpendicularly to axis (350), in order to reduce interference. Additionally, monopole antenna (330) is offset axially in order to reduce interference. In an exemplary embodiment, monopole antenna (340) is not offset axially but in another configuration, an axial offset may reduce interference and improve insertion loss. By these lateral and axial offsets, the insertion loss is improved. It should be understood that the receiving monopole antennas, not shown, are similarly offset.

The monopole antennas function either as signal feeding or signal receiving structures. Signal feeding/receiving antennas exist on both ends of an SIW. At each SIW end, two monopole antennas exist with each operating at a different frequency. At each SIW end, the first monopole antenna length and location in the SIW relative to the back wall are determined for the first monopole antenna operating frequency; and the second monopole antenna length and location in the SIW relative to the back wall are determined for the second monopole antenna operating frequency. Each signal would have its own frequency range and there would be no crosstalk.

While the embodiments described with reference to the figures include dividing the wide frequency band into two halves, it should be understood that the dominant mode frequency range can be subdivided further, into thirds, quarters, or more. Additional monopole antennas would require the placement to be optimized by a lateral and axial offset to reduce interference and improve insertion loss. The width of the SIW determined by the spacing between SIW side walls made of tightly pitched ground vias determines the frequency range of the dominant mode and the waveguide dominant mode cut off frequency. A narrow SIW would have a high frequency and a wider frequency range dominant mode.

Figure 4:
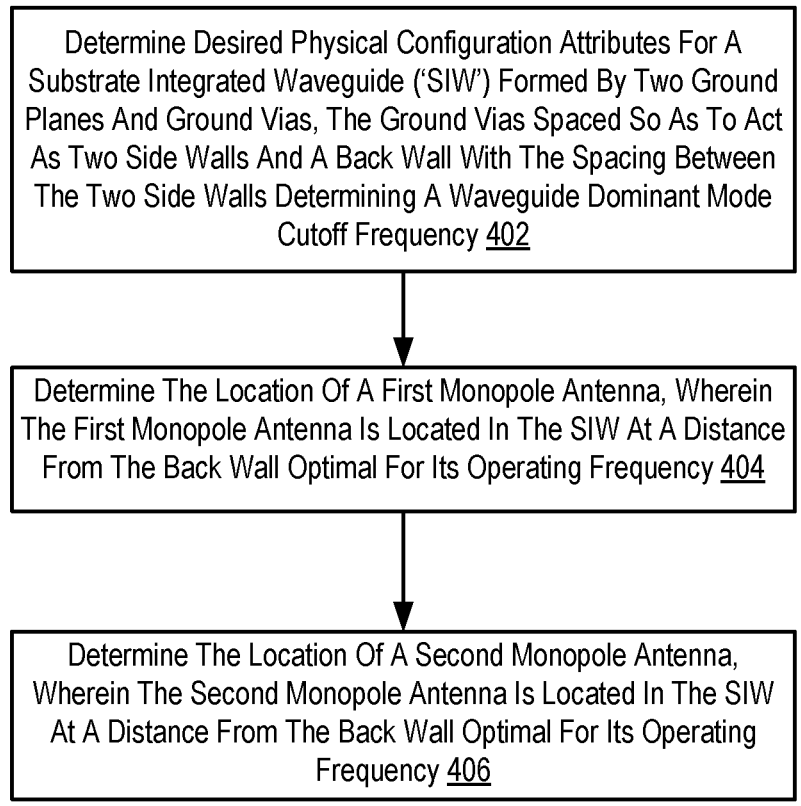
FIG. 4 sets forth a flow chart illustrating an exemplary method for providing a PCB with SIW that uses multi-band monopole antenna feeds for high speed communications according to embodiments of the present disclosure.

For further explanation, FIG. 4 sets forth a flow chart illustrating an exemplary method for providing a PCB with SIW that uses multi-band monopole antenna feeds for high speed communications according to embodiments of the present disclosure. The example method depicted in FIG. 4 includes determining (402) desired physical configuration attributes for a substrate integrated waveguide ('SIW') formed by two ground planes and ground vias, the ground vias spaced so as to act as two side walls and a back wall with the spacing between the two side walls determining the waveguide dominant mode cutoff off frequency. As described in the Figures above, the width of the SIW is chosen to determine the dominant mode, formed by the two side walls of closely spaced ground vias. The dominant mode is a high frequency range, e.g. in a range of 70-128 GHz, or another selected dominant mode.

The example method depicted in FIG. 4 also includes determining (404) the location of a first monopole antenna, wherein the first monopole antenna is located in the SIW at a distance from the back wall optimal for its operating frequency. As described in FIGS. 2 and 3, the monopole antenna is a quarter wave monopole antenna and is placed at a determined distance, e.g., a quarter of the guided wavelength ($\lambda_g$), from the back wall. The monopole antenna operating frequency is selected to be centered within one half of the waveguide dominant mode frequency range. In an exemplary embodiment, the monopole antenna operating frequency is centered at 112 GHz.

The example method depicted in FIG. 4 also includes determining (406) the location of a second monopole antenna, wherein the second monopole antenna is located in the SIW at a distance from the back wall optimal for its operating frequency. As described in FIGS. 2 and 3, the monopole antenna is a quarter wave monopole antenna and is placed at a determined distance, e.g., a quarter of the guided wavelength ($\lambda_g$), from the back wall. The monopole antenna operating frequency is selected to be centered within one half of the waveguide dominant mode frequency range. In an exemplary embodiment, the monopole antenna operating frequency is centered at 84 GHz.

Figure 5:
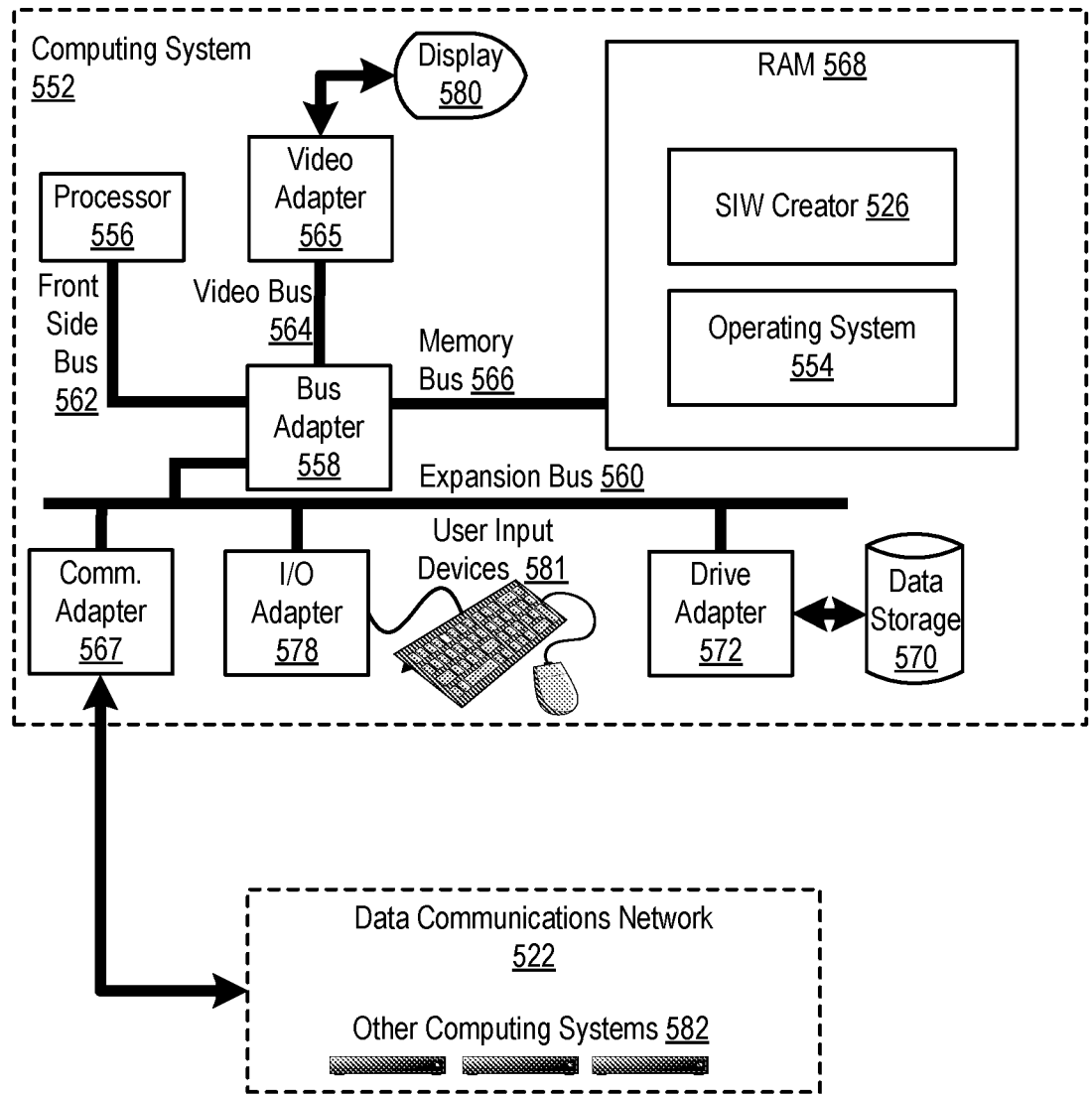
FIG. 5 sets forth a block diagram of automated computing machinery including an example computer useful in providing a PCB with SIW that uses multi-band monopole antenna feeds for high speed communications according to embodiments of the present disclosure.

For further explanation, FIG. 5 sets forth a block diagram of automated computing machinery comprising an example computer (552) useful in providing a PCB with SIW that uses multi-band monopole antenna feeds for high speed communications according to embodiments of the present disclosure. The computer (552) of FIG. 5 includes at least one computer processor (556) or 'CPU' as well as random access memory (568) ('RAM') which is connected through a high speed memory bus (566) and bus adapter (558) to processor (556) and to other components of the computer (552).

Stored in RAM (568) is an SIW creator module (526), a module of computer program instructions used for providing a PCB with SIW that uses multi-band monopole antenna feeds for high speed communications according to embodiments of the present invention. The SIW creator module (526) of FIG. 5 may be configured to provide a PCB with SIW that uses multi-band monopole antenna feeds for high speed communications by determining desired physical configuration attributes for a substrate integrated waveguide ('SIW') formed by two ground planes and ground vias, the ground vias spaced so as to act as two side walls and a back wall with the spacing between the two side walls determining the waveguide dominant mode cut off frequency, and to determine a dominant mode; determining the location of a first monopole antenna, wherein the first monopole antenna is located in the SIW at a distance from the back wall optimal for its operating frequency; and determining the location of a second monopole antenna, wherein the second monopole antenna is located in the SIW at a distance from the back wall optimal for its operating frequency.

Also stored in RAM (568) is an operating system (554). Operating systems useful in providing a PCB with SIW that uses multi-band monopole antenna feeds for high speed communications according to embodiments of the present invention include UNIX™, Linux™, Microsoft XP™, AIX™, IBM's i5/OS™, and others as will occur to those of skill in the art. The operating system (554) and the SIW creator module (526) in the example of FIG. 5 are shown in RAM (568), but many components of such software typically are stored in non-volatile memory also, such as, for example, on a disk drive (570).

The computer (552) of FIG. 5 includes disk drive adapter (572) coupled through expansion bus (560) and bus adapter (558) to processor (556) and other components of the computer (552). Disk drive adapter (572) connects non-volatile data storage to the computer (552) in the form of disk drive (570). Disk drive adapters useful in computers for providing a PCB with SIW that uses multi-band monopole antenna feeds for high speed communications according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (552) of FIG. 5 includes one or more input/output ('I/O') adapters (578). I/O adapters implement user-oriented input/output through, for example, software drivers and computer hardware for controlling output to display devices such as computer display screens, as well as user input from user input devices (581) such as keyboards and mice. The example computer (552) of FIG. 5 includes a video adapter (565), which is an example of an I/O adapter specially designed for graphic output to a display device (580) such as a display screen or computer monitor. Video adapter (565) is connected to processor (556) through a high speed video bus (564), bus adapter (558), and the front side bus (562), which is also a high speed bus.

The example computer (552) of FIG. 5 includes a communications adapter (567) for data communications with other computers (582) and for data communications with a data communications network (522). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for providing a PCB with SIW that uses multi-band monopole antenna feeds for high speed communications according to embodiments of the present invention include modems for wired dial-up communications, Ethernet (IEEE 802.3) adapters for wired data communications network communications, and 802.11 adapters for wireless data communications network communications.

In view of the explanations set forth above, readers will recognize that the benefits of providing a PCB with SIW that uses multi-band monopole antenna feeds for high speed communications according to embodiments of the present disclosure include:

Improving high speed bus communication in a PCB by providing high speed interconnects characterized by low loss and negligible crosstalk.

Improving the practical implementation of SIW in a PCB by using space more efficiently achieved as a result of multiband high speed transmission through the SIW enabled by multi-band antenna feeds.

Exemplary embodiments of the present disclosure are described largely in the context of a fully functional computer system for providing a PCB with SIW that uses multi-band monopole antenna feeds for high speed communications. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A printed circuit board (PCB') comprising:
   a substrate integrated waveguide (' SIW') formed by two ground planes and ground vias spaced so as to function as two side walls and a back wall with the spacing between the two side walls determining a waveguide dominant mode cutoff frequency;
   a first monopole antenna; and
   a second monopole antenna,
   wherein the first monopole antenna and the second monopole antenna are located in the SIW at a respective distance from the back wall optimal for a respective operating frequency of the first monopole antenna and the second monopole antenna, and wherein the first and second monopole antennas are offset laterally from an axis of the SIW perpendicular to the back wall.

2. The PCB of claim 1 wherein the operating frequency of the first monopole antenna is selected to be a first half of the waveguide dominant mode frequency range and the operating frequency of the second monopole antenna is selected to be a second half of the waveguide dominant mode frequency range.

3. The PCB of claim 1 wherein the first monopole antenna and the second monopole antenna are offset axially along an axis of the SIW perpendicular to the back wall.

4. The PCB of claim 1, further comprising:
   a third monopole antenna located in the SIW at a distance from the back wall optimal for its operating frequency, wherein the waveguide dominant mode frequency range is divided into thirds, and wherein the operating frequency of each of the first, second, and third monopole antenna is selected to be within each of the respective thirds of the waveguide dominant mode frequency range.

5. The PCB of claim 4 wherein the first monopole antenna, the second monopole antenna, and the third monopole antenna are offset laterally from an axis of the SIW and axially along the axis of the SIW.

6. The PCB of claim 1 further comprising:
a third monopole antenna; and
a fourth monopole antenna,
wherein the third monopole antenna and fourth monopole antenna are located in the SIW at a distance from the back wall optimal for each operating frequency, wherein the waveguide dominant mode frequency range is divided into quarters, and wherein the operating frequency of each of the first, second, third, and fourth monopole antenna is selected to be within each of the respective quarters of the waveguide dominant mode frequency range.

7. The PCB of claim 1, further comprising a third monopole antenna and a fourth monopole antenna, wherein the third monopole antenna and fourth monopole antenna are located in the SIW at a distance from the back wall optimal for each operating frequency of the first through fourth monopole antennas, wherein the first monopole antenna, the second monopole antenna, the third monopole antenna, and the fourth monopole antenna are offset laterally from an axis of the SIW and axially along the axis of the SIW.

8. The PCB of claim 1 wherein the first monopole antenna and the second monopole antenna are quarter wave monopole antennas.

9. A method of providing a printed circuit board (PCB') comprising:
determining, by a substrate integrated waveguide ('SIW') creator module, desired physical configuration attributes for a SIW formed by two ground planes and ground vias, the ground vias spaced so as to function as two side walls and a back wall with the spacing between the two side walls determining a waveguide dominant mode cutoff frequency;
determining a location of a first monopole antenna, wherein the first monopole antenna is located in the SIW, between the two ground planes and the two side walls of the SIW, at a first distance from the back wall optimal for its operating frequency; and
determining a second location of a second monopole antenna, wherein the second monopole antenna is located in the SIW at a second distance from the back wall optimal for its operating frequency.

10. The method of claim 9 wherein the operating frequency of the first monopole antenna is selected to be in a first half of the waveguide dominant mode frequency range and the operating frequency of the second monopole antenna is selected to be in a second half of the waveguide dominant mode frequency range.

11. The method of claim 9 wherein the first monopole antenna and the second monopole antenna are offset laterally from an axis of the SIW perpendicular to the back wall.

12. The method of claim 9 wherein the first monopole antenna and the second monopole antenna are offset axially along an axis of the SIW perpendicular to the back wall.

13. The method of claim 9, further comprising:
determining the location of a third monopole antenna; wherein the third monopole antenna is located in the SIW at a distance from the back wall optimal for its operating frequency, wherein the waveguide dominant mode frequency range is divided into thirds, and wherein the operating frequency of each of the first, second, and third monopole antenna is selected to be within each of the respective thirds of the waveguide dominant mode frequency range.

14. The method of claim 13 wherein the first monopole antenna, the second monopole antenna, and the third monopole antenna are offset laterally from an axis of the SIW and axially along the axis of the SIW.

15. The method of claim 9 further comprising:
determining the location of a third monopole antenna, wherein the third monopole antenna is located in the SIW at a distance from the back wall optimal for its operating frequency; and
determining the location of a fourth monopole antenna, wherein the fourth monopole antenna is located in the SIW at a distance from the back wall optimal for its operating frequency,
wherein the waveguide dominant mode frequency range is divided into quarters, and wherein the operating frequency of each of the first, second, third, and fourth monopole antenna is selected to be within each of the respective quarters of the waveguide dominant mode frequency range.

16. The method of claim 15 wherein the first monopole antenna, the second monopole antenna, the third monopole antenna, and the fourth monopole antenna are offset laterally from an axis of the SIW and axially along the axis of the SIW.

17. The method of claim 9 wherein the first monopole antenna and the second monopole antenna are quarter wave monopole antennas.

* * * * *